United States Patent [19]

Hirata

[11] Patent Number: 5,684,740
[45] Date of Patent: Nov. 4, 1997

[54] SEMICONDUCTOR MEMORY AND METHOD FOR SUBSTITUTING A REDUNDANCY MEMORY CELL

[75] Inventor: Masayoshi Hirata, Tokyo, Japan

[73] Assignee: NEC Corporation, Tokyo, Japan

[21] Appl. No.: 715,409

[22] Filed: Sep. 18, 1996

[30] Foreign Application Priority Data

Sep. 18, 1995 [JP] Japan .................................. 7-238012

[51] Int. Cl.$^6$ .................................................. G11C 16/04
[52] U.S. Cl. .............................. 365/185.09; 365/185.29
[58] Field of Search ........................ 365/185.33, 185.09, 365/185.29, 185.3, 200

[56] References Cited

U.S. PATENT DOCUMENTS 4,392,211  7/1983  Nakano et al. ........................ 365/200
5,410,511  4/1995  Michiyama ........................ 365/185.33
5,586,075  12/1996  Miwa ................................ 365/185.29
5,619,454  4/1997  Lee .................................... 365/185.3

FOREIGN PATENT DOCUMENTS 63-29360  6/1988  Japan .

*Primary Examiner*—David C. Nelms
*Assistant Examiner*—Son Mai
*Attorney, Agent, or Firm*—Foley & Lardner

[57] ABSTRACT

In a flash memory, each of substitution information circuits associated to a redundant memory cell array has an erase circuit for erasing the substitution information stored in memory cells in the substitution information circuit when the defectiveness of the corresponding memory cell in a main memory cell array is dissolved.

8 Claims, 8 Drawing Sheets

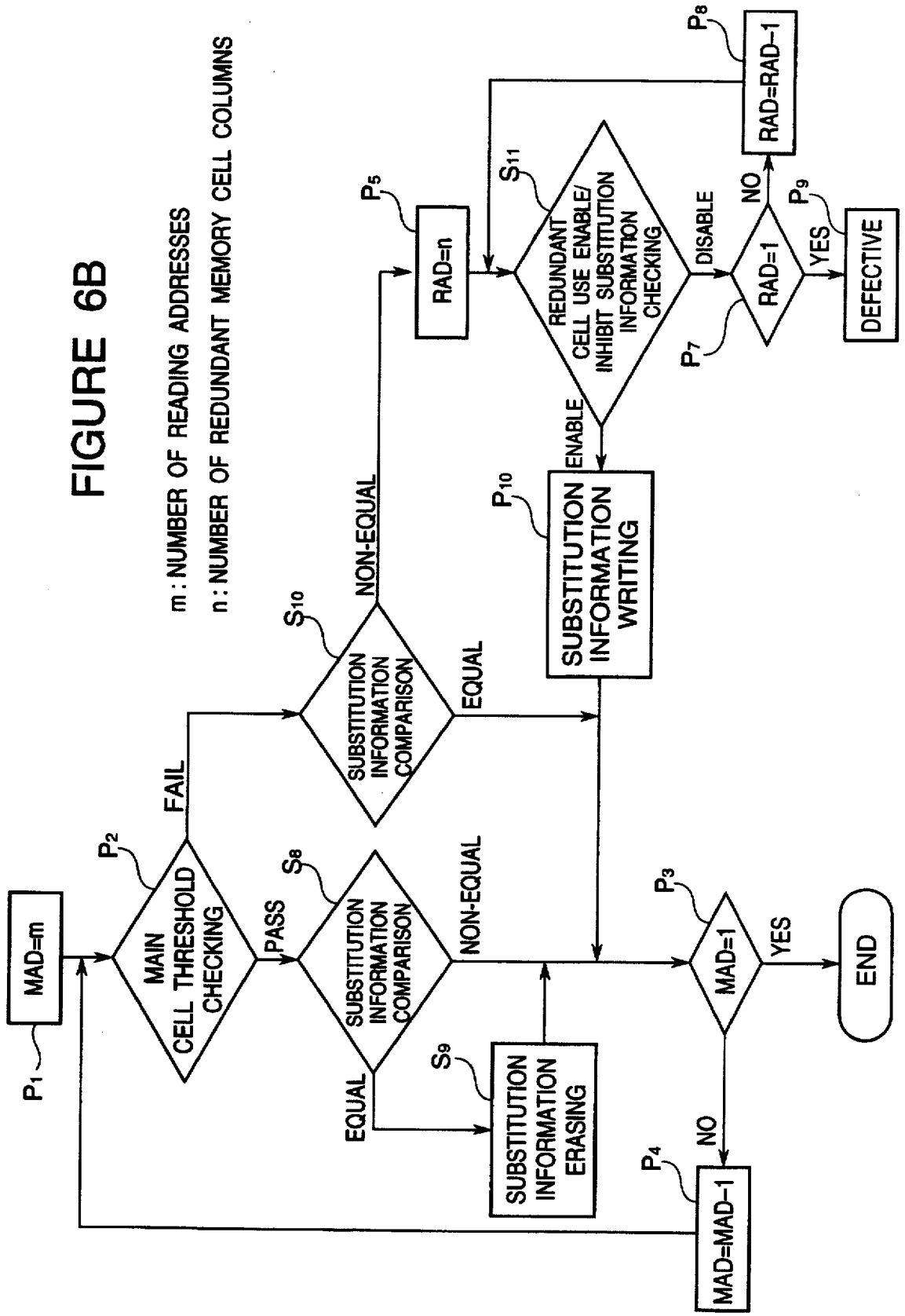

SEMICONDUCTOR MEMORY AND METHOD FOR SUBSTITUTING A REDUNDANCY MEMORY CELL

BACKGROUND OF THE INVENTION

1. Field of the Invention

The present invention relates to a semiconductor memory, and more specifically a flash electrically erasable programmable non-volatile semiconductor memory (flash memory) having redundant cell arrays.

2. Description of Related Art

In an electrically erasable programmable non-volatile semiconductor memory, in particular, in a flash electrically erasable programmable non-volatile semiconductor memory (flash memory) configured to store one bit of information by one floating gate electric field effect transistor, there occurs a defective phenomenon called an erratic erase, inherent to the time of erasing a stored data.

Now, the mechanism of the generation of the above mentioned erratic erase will be described with FIG. 1A, which is a graph illustrating a threshold distribution of memory cells at the time of erasing the flash memory. The flash memory is erased in such a manner that, at a preprogramming which is a first step in a data erasing operation, hot electrons are injected into the floating gate of all the memory cells, so as to elevate the threshold of the memory cells to a high potential so that all the memory cells have a uniform high threshold. In other words, a difference between the thresholds of respective memory cells is minimized. At this time, the thresholds of the memory cells become in the potential difference range of 1V to 2V, as shown by the curved line "a" in FIG. 1A. Then, in order to lower the threshold, a high voltage and a ground potential (GND) are applied to a source and a control gate of all the memory cells, so that a high electric field is applied between the source and the floating gate. With this high electric field applied, the electrons tunnel from the floating gate to the source, with the result that the threshold drops. This operation will be called an "erase". This erase operation is carried out until the threshold value becomes not higher than a certain value, in the shown example, 3V. At this time, the lowered thresholds of most of the memory cells become in the potential difference range of 1V to 2V, as shown by the curved line "b" in FIG. 1A, but a small number of memory cells have threshold of not larger than 0V, as shown by the curved line "c" in FIG. 1A. This small number of memory cells will be called an "overerase defective cell".

If the overerase defective cells are repeatedly written and erased, some proportion of overerase detective cells become not exhibiting an overerase defective, and behave like a non-defective memory cell. This temporary overerase phenomenon of the memory cell is called an "erratic erase", and is distinguished from the overerase defective of the overerase defective cell which is not returned to the non-defective memory cell although the writing and the erasing are repeatedly carried out.

Referring to FIG. 1B, there is shown a graph illustrating a change of the threshold with the number of erases in the erratic erase phenomenon. In the graph of FIG. 1B the axis of abscissas indicates the number of writes/erases, while the axis of coordinates shows the threshold of the memory cell. A major part of the erased memory cells has a threshold in the range of 0.5V to 3.0V as shown by the dotted line. The curved lines "a" and "b" illustrates the change of the threshold of two memory cells with the number of erases. Namely, the memory cell identified with the line "a" behaves as the normal memory cell until the number of writes/erases reaches $4 \times 10^3$, but becomes the overerase defective after the number of writes/erases reaches $4 \times 10^3$. On the other hand, the memory cell identified with the line "b" is the overerase defective before the number of writes/erases reaches $2 \times 10^3$, and during a period in which the number of writes/erases reaches from $7 \times 10^3$ to $9 \times 10^3$. The memory cell "b" behaves as the normal memory cell during the other period. Like this, the erratic erase is a phenomenon in which the memory cell which was the overerase defective suddenly returns to the normal memory cell with repetition of writes/erases, or the memory cell which was firstly the normal memory cell suddenly becomes the overerase defective but returns to the normal memory cell with further repetition of writes/erases. Therefore, the erratic erase is a faulty mode inherent to the flash memory.

In the prior art, there has been a semiconductor memory so configured that if a defective memory cell is found at the time of writing or erasing the semiconductor memory, the defective memory cell is automatically replaced with a redundant memory cell, internally within the semiconductor memory cell, for the purpose of relieving the defectiveness.

Referring to FIG. 2, there is shown an example of a prior art semiconductor memory so configured to have an automatic redundant memory cell substituting means for automatically substituting a redundant memory cell for an overerased defective memory cell, when the defective memory cell is found in a main, namely, non-redundant memory cell array in the preprogramming step and the erasing step of the erasing operation, particularly after completion of the memory cell erasing operation.

The shown prior art semiconductor memory includes a main memory cell array 1, a row decoder 2, a column decoder 3 and a column selection circuit 4 for selecting a memory cell within the main memory cell array 1, a redundant memory cell array 5 and a redundant cell selection circuit 6 for selecting a redundant memory cell within the redundant memory cell array 5, a sense amplifier 7 for reading out data from the main memory cell array 1 or the redundant memory cell array 5, a data comparison circuit 8 for comparing the data outputted from the sense amplifier 7 with an expected value, an address counter 9 for generating an address within the main memory cell array 1, "n" substitution information circuits 201, 202, ..., 20n of the same construction for storing a redundant cell substitution information, a substitution information control circuit 11 for writing the substitution information into the substitution information circuits 201, 202, ..., 20n or reading the substitution information from the substitution information circuits 201, 202, ..., 20n, and switch circuits (selection transistors) S1, S2, ..., Sn for selecting the substitution information circuits 201, 202, ..., 20n.

The the substitution information circuit 201 includes memory elements M1, M2, ..., M$_{K+2}$ for storing a redundant memory cell selection information for substituting a redundant memory cell for a defective memory cell, namely, a substitution information, and a defective memory cell address, substitution information write circuits W1, W2, ..., W$_{K+2}$ associated to the memory elements M1, M2, ..., M$_{K+2}$, respectively, discriminating circuits H1, H2, ..., H$_{K+2}$ each for discriminating whether or not the information read out from the corresponding memory element M1, M2, ..., or M$_{K+2}$ has a predetermined value or a given value, and an AND circuit A11 receiving an output of all the discriminating circuits H1, H2, ..., H$_{K+2}$. For example, each of the memory elements M1, M2, ..., M$_{K+2}$ is formed of an electrically programmable non-volatile semiconductor memory memory cell such as EEPROM cell, and each of discriminating circuits $H_1, H_2, \ldots, H_{K+2}$ is formed of an exclusive-NOR circuit.

Now, a procedure of a flash memory erasing operation will be described with reference to the flow chart of FIG. 3, which illustrates the memory cell erasing operation including the redundant memory cell substitution.

As mentioned hereinbefore, first, the preprogramming is carried out (Step $Q_1$), and then, the erasing is conducted (Step $Q_3$). When a defective memory cell is found out in the preprogramming step $Q_1$ or in the erasing step $Q_3$, the operation moves to a redundant cell substitution step (Step $Q_2$ or Step $Q_4$). If the redundant cell substitution is performed without fail, namely, results in "pass", the operation moves to a next step. On the other hand, if the redundant cell substitution is impossible, namely, results in "fail", it is judged as defective and the operation is ended (Step $Q_5$).

Next, a redundant memory cell substitution operation performed after the preprogramming step in the prior art semiconductor memory, will be described with reference to the flow chart of FIG. 4, illustrating a conventional redundant memory cell substitution procedure.

First, a "variable" region is prepared within registers provided in the flash memory, and the number of reading addresses is substituted into a register allocated to a variable MAD (Step P1). Then, a reading is carried out by applying a predetermined constant voltage to a control gate of each memory cell within the main or non-redundant memory cell array, in order to check the threshold of respective main memory cells (Step P2). For example, in the case of checking the threshold level after the preprogramming, a gate voltage of about 6 V to 7 V is applied to the control gate. If the main memory cell has its threshold not smaller than the applied gate voltage mentioned above, the main memory cell "passes" the checking, and the operation goes to the step P3. To the contrary, if the main memory cell has its threshold smaller than the applied gate voltage mentioned above, the main memory cell "fails" the checking, and the operation goes to the step P5.

In the step P3, whether or not the variable MAD is equal to 1, is discriminated. If MAD=1, the redundant cell substitution operation is ended. If MAD≠1, the variable MAD is decremented by "1" in a step P4, and the operation returns to the step P2, so that the threshold of the main memory cell at a next address is checked.

In steps P5 to P10, the redundant cell substitution is carried out as follows:

First, in the step P5, the number of substituting redundant cells (the number "n" of substituting redundant cell columns) is substituted into a register for a variable RAD, and in the step P6, whether or not a selection information is stored in a memory cell for substitution information, is checked. If the selection information is stored, the operation goes into the step P7, and if the selection information is not stored, the operation goes into the step P10.

In the step P7, whether or not the variable RAD is equal to "1" is checked, and if RAD=1, it means that there is no redundant memory cell which can be used as a substitute cell. Namely, the substitution fails (Step P9). If RAD≠1, the operation goes into the step P8, where the variable RAD is decremented by "1", and the operation returns to the step P6, in which the content of a next substitution information memory cell storing a next selection information is checked.

When the operation goes into the step P10, this means that a redundant memory cell can be used as a substitute cell. In the step P10, substitution information (redundant memory cell selection information and an address of a defective main memory cell) is written into the substitution information memory cell. With this writing, the redundant cell substitution operation is completed, and the operation returns to the step P2.

Next, a redundant memory cell substitution operation performed after the erasing step is carded out similarly to the redundant memory cell substitution operation performed after the preprogramming step, excepting for the following:

When the threshold of the main memory cell is checked in the step P2, a voltage of about 0 V to 1 V is applied to the control gate. If the main memory cell has its threshold not smaller than the applied gate voltage mentioned above, the main memory cell "passes" the checking, and the operation goes to the step P3. To the contrary, if the main memory cell has its threshold smaller than the applied gate voltage mentioned above, the main memory cell "fails" the checking, and the operation goes to the step P5.

The above mentioned processing flow is performed for each erasing operation of the flash memory, and the redundant cell is automatically switched or selected.

Returning to FIGS. 2 and 4, operation of the conventional semiconductor memory will be described. For convenience of description, assume that a memory cell storing the redundant memory cell selection information is a memory cell M1 in the substitution information circuit 201.

First, the number of reading addresses $\{2^{(K+1)}\}$ is set in the address counter 9 with a signal SET (Step P1). On the basis of an internal address signal generated from the address counter 9, data is read out from the main memory cell array 1, and the read-out data is supplied to the data comparison circuit 8. The data comparison circuit 8 compares the read-out data with an expected value, and outputs a comparison result signal P to the address counter 9 and the substitution information control circuit 11 (Step P2). If the data read out from the main memory cell array 1 is coincident with the expect value, the operation goes into the step P3, in which, whether or not the data MAD in the address counter 9 is equal to "1", is examined. If MAD=1, the redundant cell substitution is completed, and a signal END is outputted. If MAD≠1, the operation goes into the step P4, the content of the address counter 9 is decremented by "1", and then, the operation returns to the step P2, in which the reading of the main memory cell array 1 is carried out.

If the read-out data is not coincident with the expect value in the step P2, the operation goes into the step P5 in which the number of columns in the redundant memory cell array 5 is substituted into a counter (not shown) in the substitution information control circuit 11. Then, the substitution information control circuit 11 outputs a signal FS and reads out the content of the memory cell (M1 in the shown example) storing the redundant memory cell selection information, in the substitution information circuit 201, in order to check whether or not the redundant memory cell array 5 is used (Step P6). The result of the reading is outputted as a signal US to the substitution information control circuit 11. If the signal US indicates that a redundant memory cell column corresponding to the substitution information circuit 201 is in use, the operation goes into the step P7. In the step P7, whether or not the data RAD in the counter within the substitution information control circuit 11 is equal to "1", is checked. If RAD=1, it is judged that the redundant memory substitution is no longer possible, and then, the redundant memory substitution is ended by outputting a signal EF (Step P9). If RAD≠1, the operation goes into the step P8, the content of the counter within the substitution information control circuit 11 is decremented by "1", and then, the redundant memory selection information is read out from the substitution information circuit corresponding to the decremented content of the counter within the substitution information control circuit 11.

In the step P6, if the signal US indicates that a corresponding redundant memory cell column is not in use, the operation goes into the step P10. In the step P10, the substitution information control circuit 11 outputs a signal FW to the substitution information circuit 20₁ so that the redundant memory cell selection information is written into the memory cell M1 by the write circuit W1, and an address at that time (namely, defective address data) is written into the memory cells M2 to M$_{K+2}$ by the write circuits W2 to W$_{K+2}$. Thereafter, the main memory cell array 1 is read out again. In the manner as mentioned above, the redundant memory cell substitution processing is performed and completed, or the operation goes into the defective step.

Referring to FIG. 2, operation for reading the main memory cell array 1 partially replaced with the redundant memory cell array.

At the time of reading the memory, an input address ADD is to the row decoder 2, the column decoder 3 and the substitution information circuits 20₁ to 20$n$. In each of the substitution information circuits 20₁ to 20$n$, all of the discrimination circuits discriminate whether or not the address ADD is coincident with the substitution information held in the substitution information circuit. Specifically, the discrimination circuit H1 discriminates whether or not the content stored in the memory cell M1 is coincident with the redundant memory cell selection information, and the discrimination circuits H2 to H$_{K+2}$ discriminate whether or not the address ADD is coincident with the defective address held in the memory cells M2 to M$_{K+2}$. If all is coincident, the AND gate A11 outputs a signal RED, and the redundant cell selection circuit 6 responds to the signal RED to deactivate the column selection circuit 4 and to select, within the redundant memory cell array 5, a redundant memory cell column corresponding to the substitution information circuit which has outputted the signal RED, with the result that the sense amplifier 7 outputs, to an input/output I/O, data read out from the selected redundant memory cell. On the other hand, if the redundant memory cell array is not substituted, the AND gate A11 of the substitution information circuit does not output the signal RED, and therefore, the main memory cell is selected within the main memory cell array 1 in accordance with the address ADD, and the data read out from the selected main memory cell is outputted to the input/output I/O.

In addition to the above mentioned conventional method for storing the substitution information for the redundant memory cell 5, in the electrically programmable non-volatile semiconductor memory cell, for example, Japanese Patent Application Post-Examination Publication No. JP-B-63-029360 and its corresponding U.S. Pat. No. 4,392,211 discloses a method for storing the substitution information by using the fuse cell.

In the above mentioned conventional semiconductor memory and methods for substituting the redundant memory cell, the electrically programmable non-volatile semiconductor memory cell or the fuse cell is used for storing the substitution information. However, when the substitutive redundant memory cell is substituted for the memory cell in which the erratic erase inherent to the flash memory occurs, the substitutive redundant memory cell is maintained in the substituted condition, even if the erratic erase is dissolved, by repetition of the writing/erasing, in the memory cell replaced with the substitutive redundant memory cell. Namely, the redundant memory cell continues to be wastefully used.

Therefore, in order to cope with the erratic erases which occur at random, it is necessary to provide a number of redundant memory cells and peripheral circuits for controlling the redundant memory cells, with the result that a chip area is inevitably increased.

SUMMARY OF THE INVENTION

Accordingly, it is an object of the present invention to provide a semiconductor memory and method for substituting a redundancy memory cell, which has overcome the above mentioned defect of the conventional one.

Another object of the present invention is to provide a semiconductor memory and method for substituting a redundancy memory cell, which can realized with a reduced number of redundant memory cells.

The above and other objects of the present invention are achieved in accordance with the present invention by a flash electrically erasable programmable non-volatile semiconductor memory comprising:

a main memory cell part including a number of main memory cells;

a redundant memory cell part divided into a plurality of substitution units each of which includes a plurality of redundant memory cells and each of which is to be substituted for a unit of the same number of main memory cells containing a defective main memory cell; and an automatic substituting means including a plurality of substitution information storing means each having a memory element storing the substitution information for a corresponding one of the substitution units of the redundant memory cell part, and a substitution information control means for controlling a writing and a reading of the substitution information in the plurality of substitution information storing means, wherein each of the plurality of substitution information storing means includes an erase means for erasing, when the defectiveness of the defective main memory cell in the main memory cell array is dissolved, the substitution information stored in the memory element in the substitution information storing means corresponding to the defective main memory cell.

According to another aspect of the present invention, there is provided a method for substituting a redundant memory cell in a flash electrically erasable programmable non-volatile semiconductor memory which comprises:

a main memory cell part including a number of main memory cells;

a redundant memory cell part divided into a plurality of substitution units each of which includes a plurality of redundant memory cells and each of which is to be substituted or a unit of the same number of main memory cells containing a defective main memory cell; and an automatic substituting means including a plurality of substitution information storing means each having a memory element storing the substitution information for a corresponding one of the substitution units of the redundant memory cell part, the method comprising:

a first step of detecting a defective main memory cell having a threshold lower than a predetermined normal threshold, in the main memory cell part at the time of a flash erasing of the main memory cell part;

a second step of, when no defective main memory cell is not found as the result of the detecting in the first step, erasing the substitution information stored in the substitution information storing means; and a third step of, when a defective main memory cell is found as the result of the detecting in the first step, substituting one redundant memory cell substitution unit for a unit of the same number of main memory cells including the defective main memory cell.

The above and other objects, features and advantages of the present invention will be apparent from the following description of preferred embodiments of the invention with reference to the accompanying drawings.

BRIEF DESCRIPTION OF THE DRAWINGS

FIGS. 6A and 6B are a flow chart illustrating a redundant memory cell substitution procedure in accordance with the present invention.

DESCRIPTION OF THE PREFERRED EMBODIMENTS

Figure 1A:
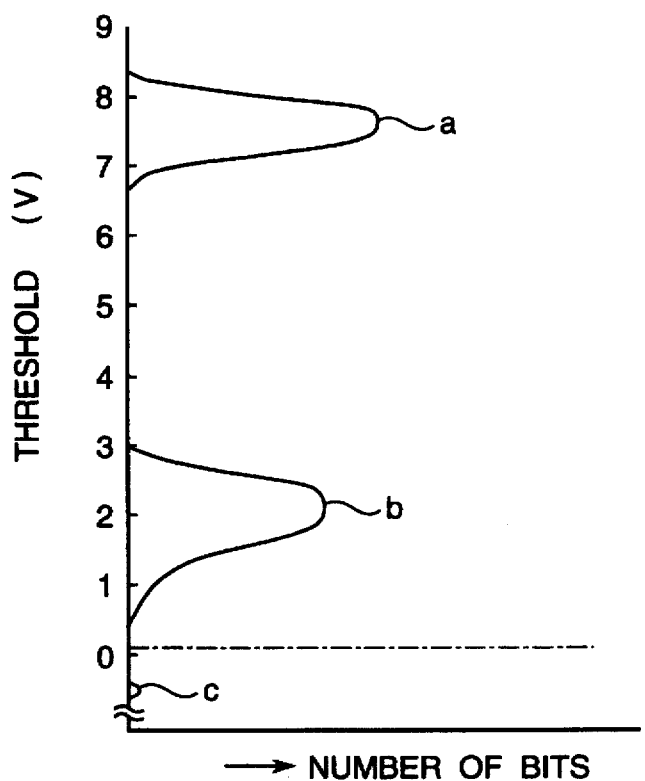
FIG. 1A is a graph for illustrating the mechanism of the generation of the erratic erase in the flash memory.
Figure 1B:
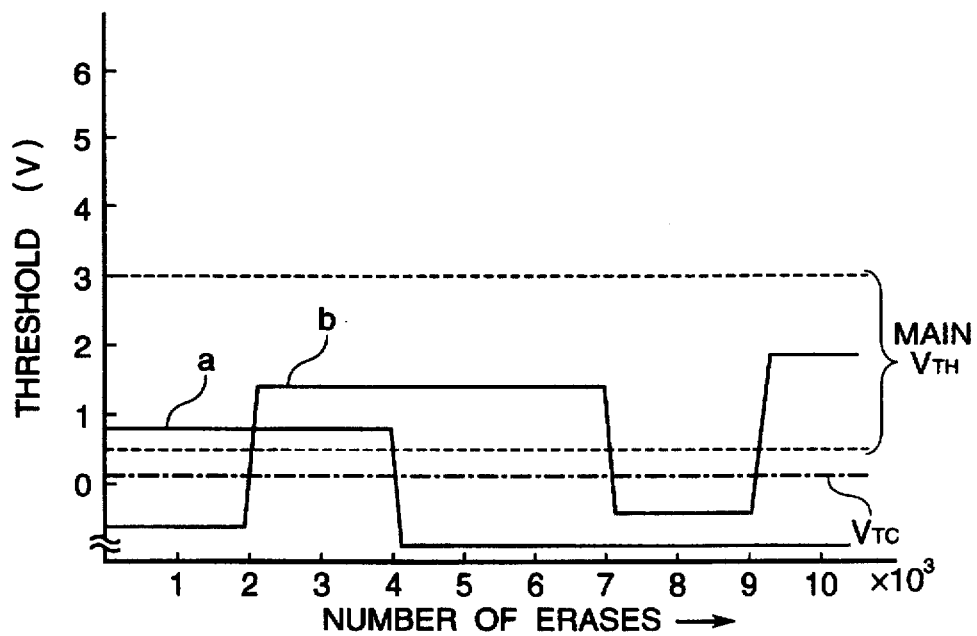
FIG. 1B is a graph illustrating a change of the threshold with the number of erases in the erratic erase phenomenon.
Figure 2:
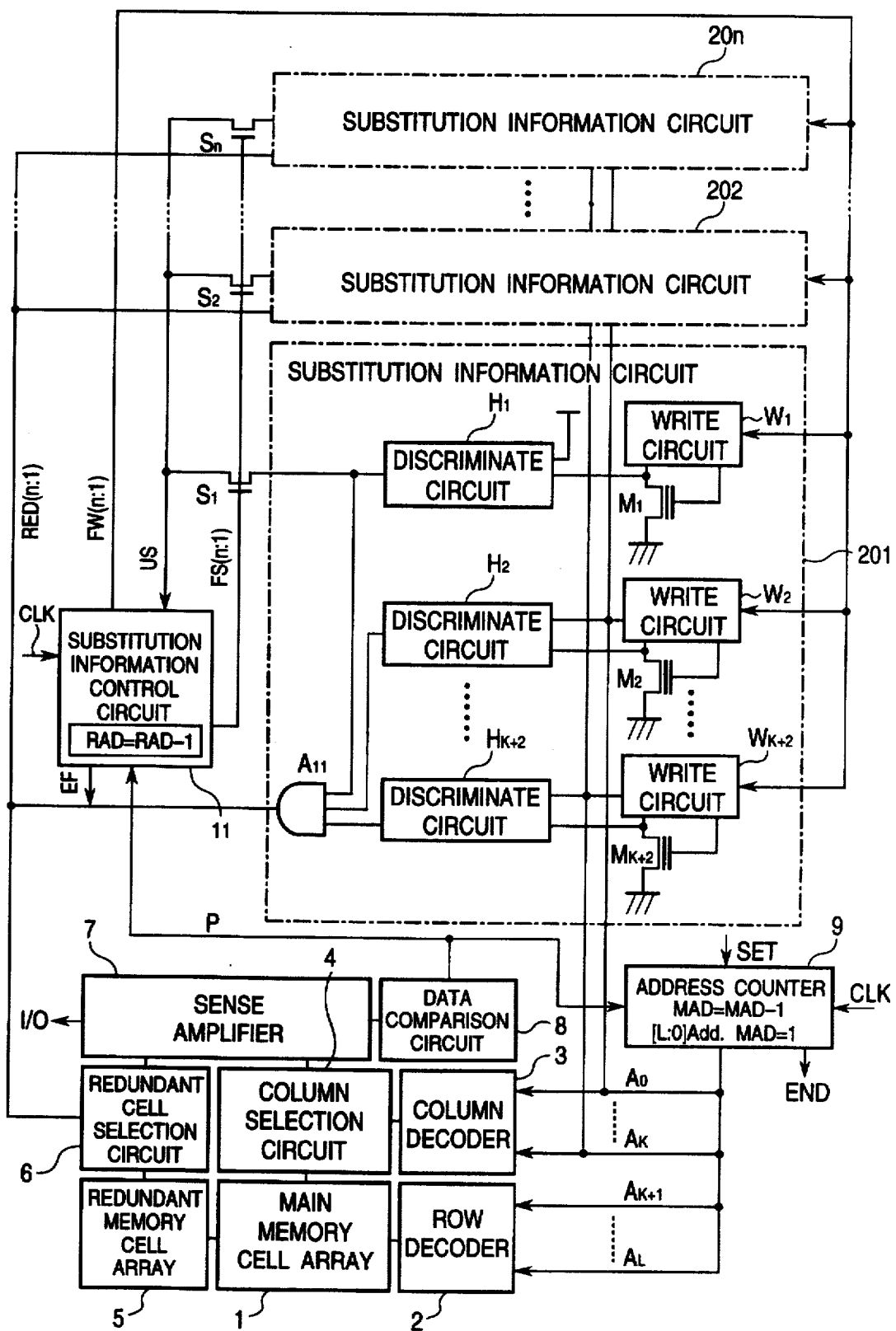
FIG. 2 is a block diagram illustrating an example of a prior art semiconductor memory so configured to have an automatic redundant memory cell substituting means for automatically substituting a redundant memory cell for a defective memory cell.
Figure 3:
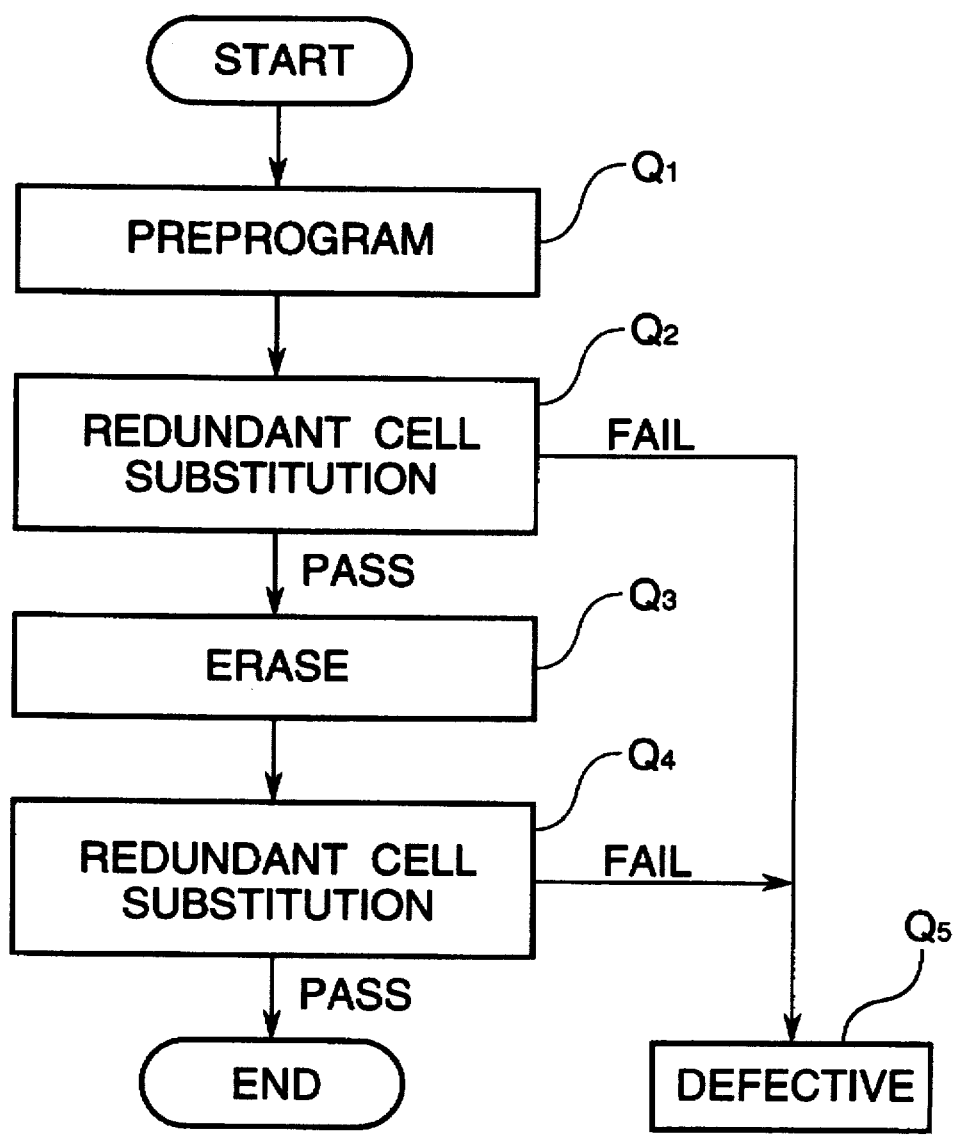
FIG. 3 is a flow chart illustrating the memory cell erasing operation including the redundant memory cell substitution.
Figure 5:
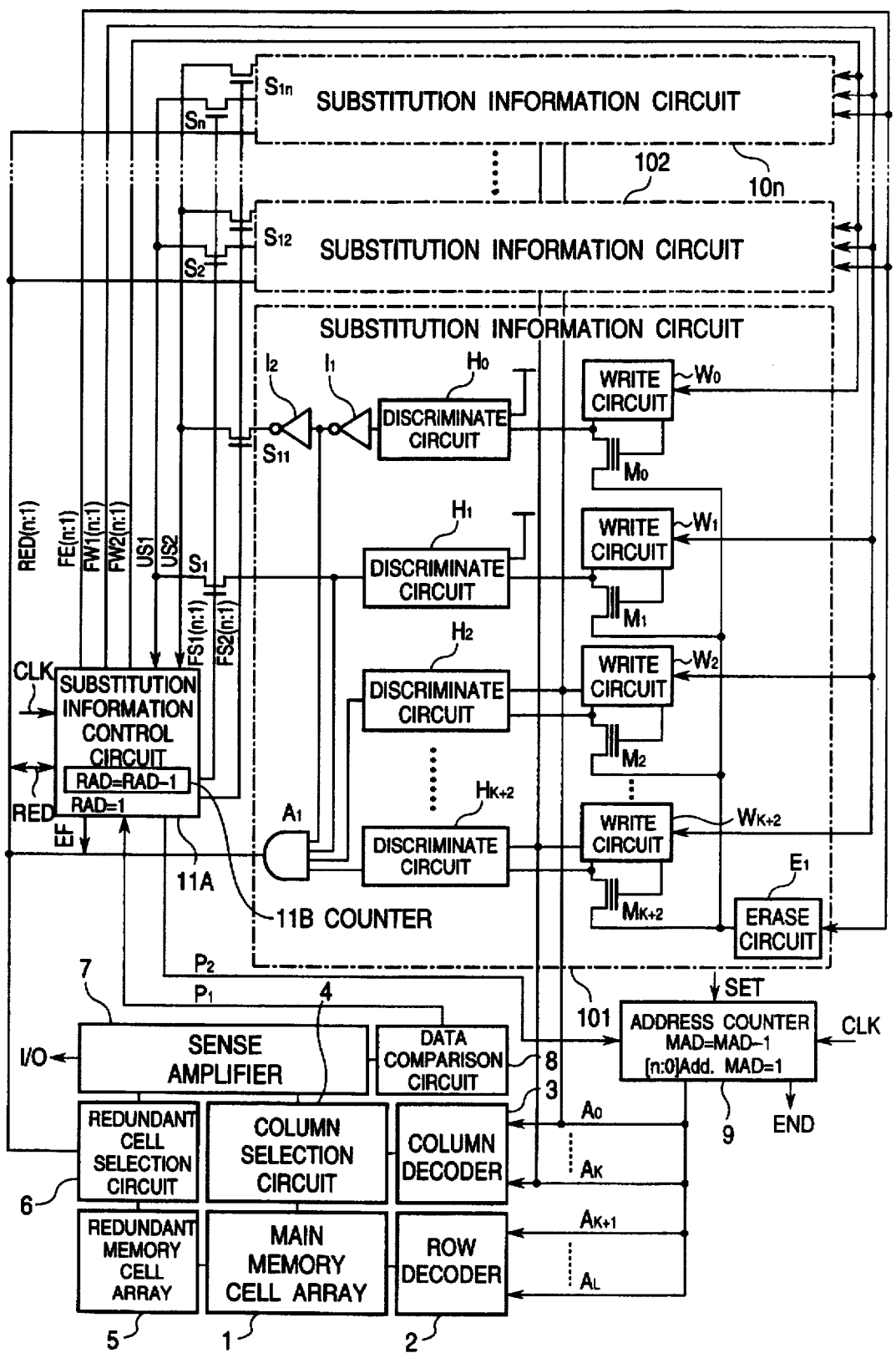
FIG. 5 is a block diagram illustrating a first embodiment of the semiconductor memory in accordance with the present invention.

Referring to FIG. 5, there is shown a block diagram illustrating a first embodiment of the semiconductor memory in accordance with the present invention. In FIG. 5, elements similar to those shown in FIG. 2 are given the same Reference Numerals and Signs.

The shown embodiment includes a main memory cell array 1, a row decoder 2, a column decoder 3, a column selection circuit 4, a redundant memory cell array 5, a redundant cell selection circuit 6, a sense amplifier 7, a data comparison circuit 8, an address counter 9, and switch circuits $S_1$ to $S_n$, similarly to the conventional example. In addition, the shown embodiment includes "n" substitution information circuits 101 to 10n (in place of the "n" substitution information circuits 201 to 20n) of the same construction for storing the redundant cell substitution information, each additionally having a memory cell for storing a redundant memory cell use inhibit information, a substitution information control circuit 11A (in place of the substitution information control circuit 11) for writing and reading the redundant cell substitution information in the substitution information circuits 101 to 10n, and switch circuits $S_{11}$ to $S_{1n}$ (each formed of a transistor) for selecting the selection inhibit information for the substitution information circuits 101 to 10n.

Each of the substitution information circuits 101 to 10n includes, similarly to the conventional substitution circuit 201, memory cells $M_1$, $M_2$, ..., $M_{K+2}$, substitution information write circuits $W_1$, $W_2$, ..., $W_{K+2}$ associated to the memory cells $M_1$, $M_2$, ... $M_{K+2}$, respectively, discriminating circuits $H_1$, $H_2$, ..., $H_{K+2}$ each for discriminating whether or not the information read out from the corresponding memory cell $M_1$, $M_2$ ..., or $M_{K+2}$ has a predetermined value or a given value, and further includes a memory cell $M_0$ which is similar to the memory cells $M_1$, $M_2$ ..., $M_{K+2}$ and which is provided to store the redundant memory cell use inhibit information, a discriminating circuit $H_0$ for discriminating the data read out from the memory cell $M_0$, an inverter $I_1$ receiving an output of the discriminating circuit $H_0$, another inverter $I_2$ receiving an output of the inverter $I_1$, an AND circuit $A_1$ (in place of the AND circuit $A_{11}$) receiving the output of the inverter $I_1$ and the output of the discriminating circuits $H_1$, $H_2$, ..., $H_{K+2}$, for outputting the result of the logical product operation, and an erase circuit $E_1$ connected to all the memory cells $M_0$, $M_1$, $M_2$ ..., $M_{K+2}$.

Figure 4:
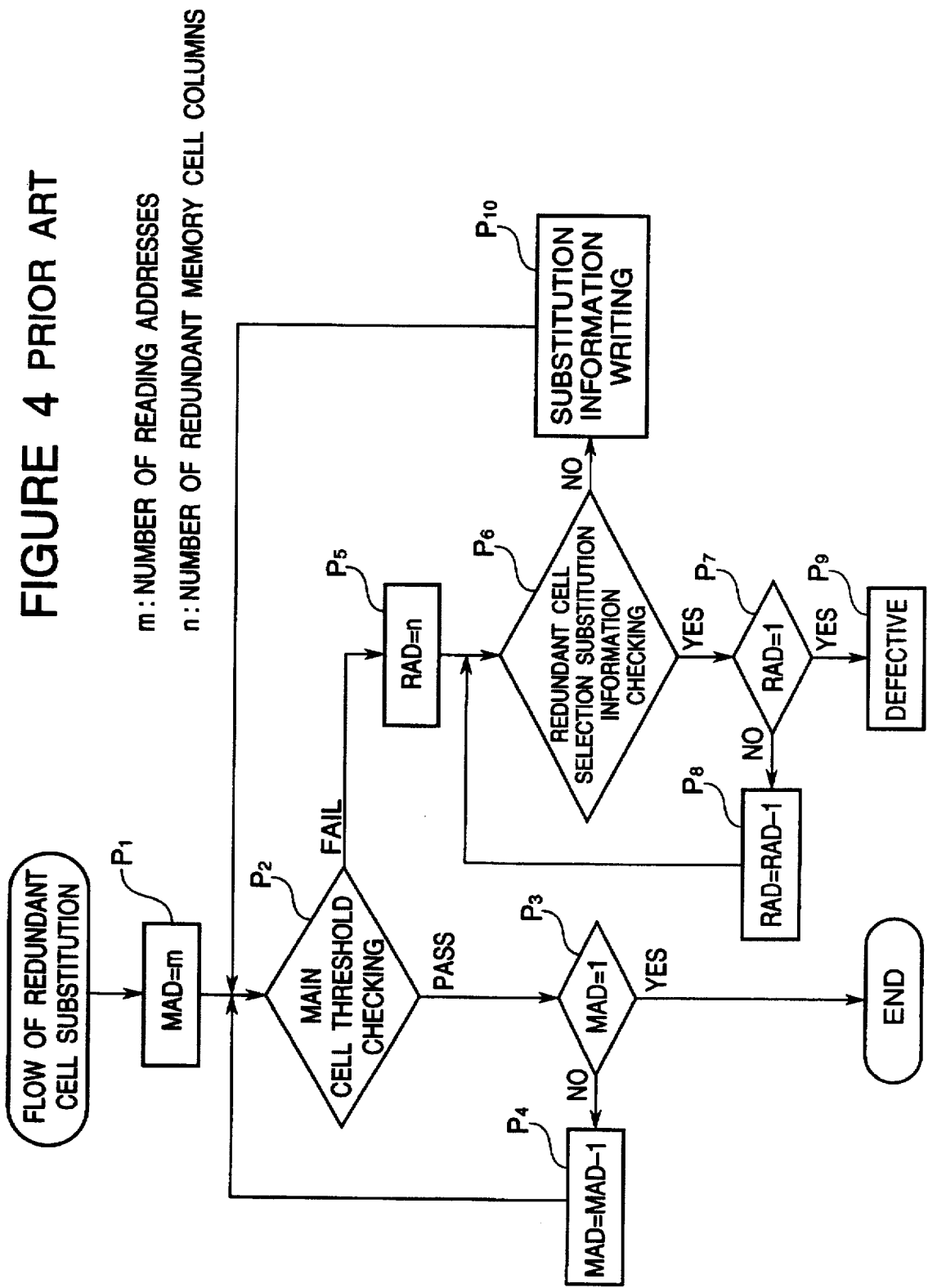
FIG. 4 is a flow chart illustrating a conventional redundant memory cell substitution procedure.
Figure 6A:
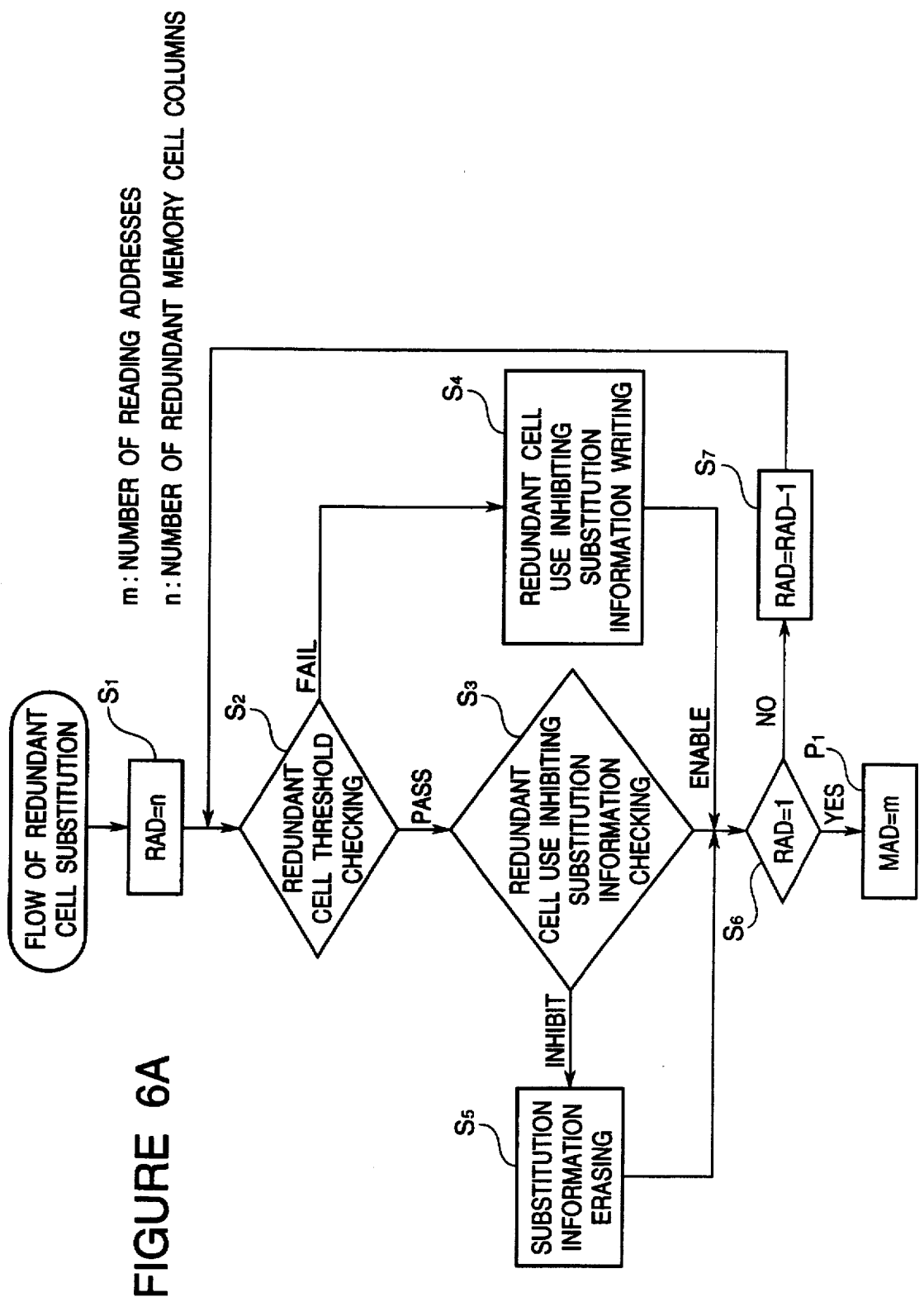

Now, a redundant memory cell substitution operation for an erratic erase defective cell which have occurred after the flash memory erasing operation, will be described with reference to FIG. 5 and FIGS. 6A and 6B which are a flow chart illustrating a redundant memory cell substitution procedure in accordance with the present invention. In FIGS. 6A and 6B, steps similar to those shown in FIG. 4 are given the same Reference Signs. For simplification of description, it is assumed that the substitution information circuit 101 is used, and the redundant memory cell selection information and the redundant memory cell use inhibit information are stored in the memory cells $M_1$ and $M_0$, respectively, of the substitution information circuit 101.

First, whether or not the substitutive redundant memory cell is in an overerased defective condition because of the erasing operation, is checked. For this purpose, the number of redundant memory cell columns in the redundant memory cell array 5 is set in a counter 11B in the substitution information control circuit 11A (variable RAD=n) (Step $S_1$). Next, the substitution information control circuit 11A outputs a signal RED to the redundant cell selection circuit 6, to cause the redundant cell selection circuit 6 to select a redundant cell column substituted for the main memory cell column selected by the column decoder 3. At this time, the row decoder 2 is a full selection condition of selecting all word lines. Thus, the redundant cells in the redundant cell column are read out by the sense amplifier 7, and the read-out data is supplied to the data comparison circuit 8. Here, a discriminating threshold value, in this case, 0 V for checking the overerased defective, is applied to the control gate of the redundant memory cells, and the sense amplifier senses 7 whether the read-out cell is an on-cell or an off-cell, so that the result of the sensing is supplied to the data comparison circuit 8. The data comparison circuit 8 discriminates that the on-cell is an overerased cell and the off-cell is a non-defective cell. The result of the discrimination is supplied as a signal $P_1$ from the data comparison circuit 8 to the substitution information control circuit 11A (Step $S_2$).

If it is discriminated to be the overerased cell in the step $S_2$, the operation goes into the step $S_4$, in which the substitution information control circuit 11A outputs a signal FW2 to write an inhibit information into the memory cell $M_0$ in the substitution information circuit 101. After completion of the writing, the variable RAD is checked (Step $S_6$), and if RAD≠1 (NO), the operation goes into the step $S_7$. In the step S7, the value of the variable RAD is decremented by "1", and the operation goes into the step S2, in which the threshold of another redundant memory cell column in the redundant memory cell array 5 is checked. If RAD=1 (YES) in the step S6, the operation goes into the step P1, similarly to the conventional example.

If it is discriminated to be the non-defective cell in the step S2, the operation goes into the step S3, in which the redundant memory cell use inhibit information is read out. For this purpose, the substitution information control circuit 11A outputs a signal FS2 to a gate of the transistor of the switch circuit S11, so that the redundant memory cell use inhibit information is read out from the memory cell M0 in the substitution information circuit 101 and outputted through the switch circuit S11 as an output signal US2. As the result of this reading, the signal US2 indicates the use inhibit condition (INHIBIT), the operation goes into the step S5, in which the substitution information (namely, the redundant memory cell use inhibit information) is erased. At this time, the substitution information control circuit 11A outputs an erase signal FE to the substitution information circuit 101, so as to cause the erase circuit E1 in the substitution information circuit 101 to perform an erasing operation for all the memory cells in the substitution information circuit 101. Thereafter, the operation goes into the step S6, in which the variable RAD is checked as mentioned above.

If in the step S3 the redundant memory cell use inhibit information signal US2 does not indicate the use inhibit condition (namely, ENABLE), the operation goes directly into the step S6, in which the variable RAD is checked as mentioned above.

The above mentioned processing is a flow of processing performed at each erasing operation for checking the enable/inhibit of the use of the redundant memory cell array 5. If a redundant memory cell becomes defective because of the erratic erase, it is inhibited to use the redundant memory cell which has become defective. If the erratic erase is dissolved and the redundant memory cell becomes non-defective, the redundant memory cell can be used again.

Next, in the step P1, the number "m" of reading addresses is set as the variable MAD. For this purpose, the substitution information control circuit 11A outputs a signal P2 to the address counter 9 and sets the address number "m"=$2^{(K+1)}$ into the address counter 9. The address counter 9 generates an address signal ADD, which is supplied through the column decoder 3 to the column selection circuit 4, which in turn, selects a main memory cell column designated by the address signal ADD. At this time, the row decoder 2 is in a full selection condition of selecting all the word lines. Next, in a step P2, similarly to the step S2, about 0 V is applied to the control gate of the memory cells in the selected main memory cell column. The sense amplifier 7 senses whether the read-out cell is an on-cell or an off-cell so that the result of the sensing is supplied to the data comparison circuit 8. The data comparison circuit 8 discriminates that the on-cell is an overerased cell (FAIL) and the off-cell is a non-defective cell (PASS). The result of the discrimination is supplied as the signal P1 from the data comparison circuit 8 to the substitution information control circuit 11A. If the result of the discrimination is "PASS", the operation goes into the step S8, and if it is "FAIL", the operation goes into the step S10.

In the step S8, whether or not the redundant memory cell was used because of the overerasing in the last erasing, is checked by the signal RED obtained by comparing the address signal ADD with the substitution information held in each of substitution circuits 101 to 10n. If the signal RED indicates coincidence, the operation goes into the step S9, and if the signal RED indicates non-coincidence, the operation goes into the step P3. The coincidence means that the redundant memory cell was used after the last erasing, but since the overerased defective is dissolved in the present erasing, the substitution information control circuit 11A outputs the erase signal FE to the corresponding substitution information circuit, so as to erase the redundant memory cell substitution information, namely, all the memory cells in the corresponding substitution information circuit. As a result, the redundant memory cell column corresponding to the substitution information circuit in which the redundant memory cell substitution information was erased, is returned to an un-substituted or non-used condition (Step S9). Next, in the step P3, the variable MAD is checked. If non-coincidence is obtained in the step S8, this means that the redundant memory cell was not used after the last erasing. Therefore, the operation directly goes into the step P3 for checking the variable MAD.

In the step S10, similarly to the step S8, whether or not the redundant memory cell was used because of the overerasing in the last erasing, is checked by the signal RED obtained by comparing the address signal ADD with the substitution information held in each of substitution circuits 101 to 10n. If the signal RED indicates coincidence, the operation goes into the step P3, and if the signal RED indicates non-coincidence, the operation goes into the step P5. Since the coincidence means that the redundant cell substitution information is stored, the variable MAD is checked in the step P3. The non-coincidence means that an overerased defective newly occurs, and therefore, the operation enters in the redundant cell substitution procedure starting from the step P5.

In the step P5, the number of redundant memory cell columns is substituted as the variable RAD. At this time, the number of redundant memory cell columns is set in the counter 11B within the substitution information control circuit 11A. Next, in order to investigate a usable redundant memory cell, the redundant memory cell selection information and the redundant memory cell use inhibit information are sequentially read out from the substitution information circuit 101. Namely, the signals FS1 and FS2 are supplied to the switch circuits S1 and S11, respectively, in the order, so that in the substitution information circuit 101, the redundant memory cell selection information stored in the memory cell M1 is outputted as the signal US1 to the substitution information control circuit 11A, and the redundant memory cell use inhibit information stored in the memory cell M0 is outputted as the signal US2 to the substitution information control circuit 11A (Step S11). If the redundant memory cell selection information indicates the selection condition, and/or if the redundant memory cell use inhibit information indicates the inhibit condition (DISABLE), the operation goes into the step P7, and if the redundant memory cell selection information indicates the non-selection condition and the redundant memory cell use inhibit information indicates the usable condition (ENABLE), the operation goes into the step P10.

In the step P7, in order to check whether or not the substitution information circuit 101 being checked at the present is a final substitution information circuit, whether or not the variable RAD is equal to "1" is checked. If RAD=1, the substitution information circuit 101 being checked at the present is a final substitution information circuit, and the operation goes into the step P9. In this case, there is no longer a usable substitutive redundant memory cell column, so that the signal EF is outputted indicating the erase defective. If RAD≠1, the operation goes into the step P8, in which the variable RAD is decremented by "1" in order to read out the redundant memory cell selection information and the redundant memory cell use inhibit information from a next substitution information circuit (for example, 102).

When the operation goes into the step P10, this means that a usable substitutive redundant memory cell column exists. In this case, more specifically, a redundant memory cell column corresponding to the substitution information circuit 101 is usable. In this step P10, the substitution information (the redundant memory, cell selection information and a defective memory address of the main memory cell array) is written into the memory cells M1 to MK+2 in the substitution information circuit 101. This writing is conducted by supplying the signal FW1 from the substitution information control circuit 11A to the write circuits W1 to WK+2 in the substitution information circuit 101, so that the redundant memory cell selection information is written into the memory cell M1 and the defective memory address is written into the memory cells M2 to MK+2. Thereafter, the operation goes into the step P3, in which the variable MAD is checked.

The above flow of operations is the redundant cell substitution procedure conducted when the overerased defective newly occurs.

Finally, in the step P3, the variable MAD is checked. If MAD=1, this means that all the memory cells in the main memory cell array 1 to be checked have been checked and a necessary redundant memory cell substitution has been also completed. If MAD≠1, the operation goes into the step P4 in order to check the threshold of another memory cell column in the main memory cell array.

As seen from the above, it could be understood that the above mentioned procedure can effectively relieve the erratic erase defective in the main memory cells and the redundant memory cells in the flash memory.

Figure 7:
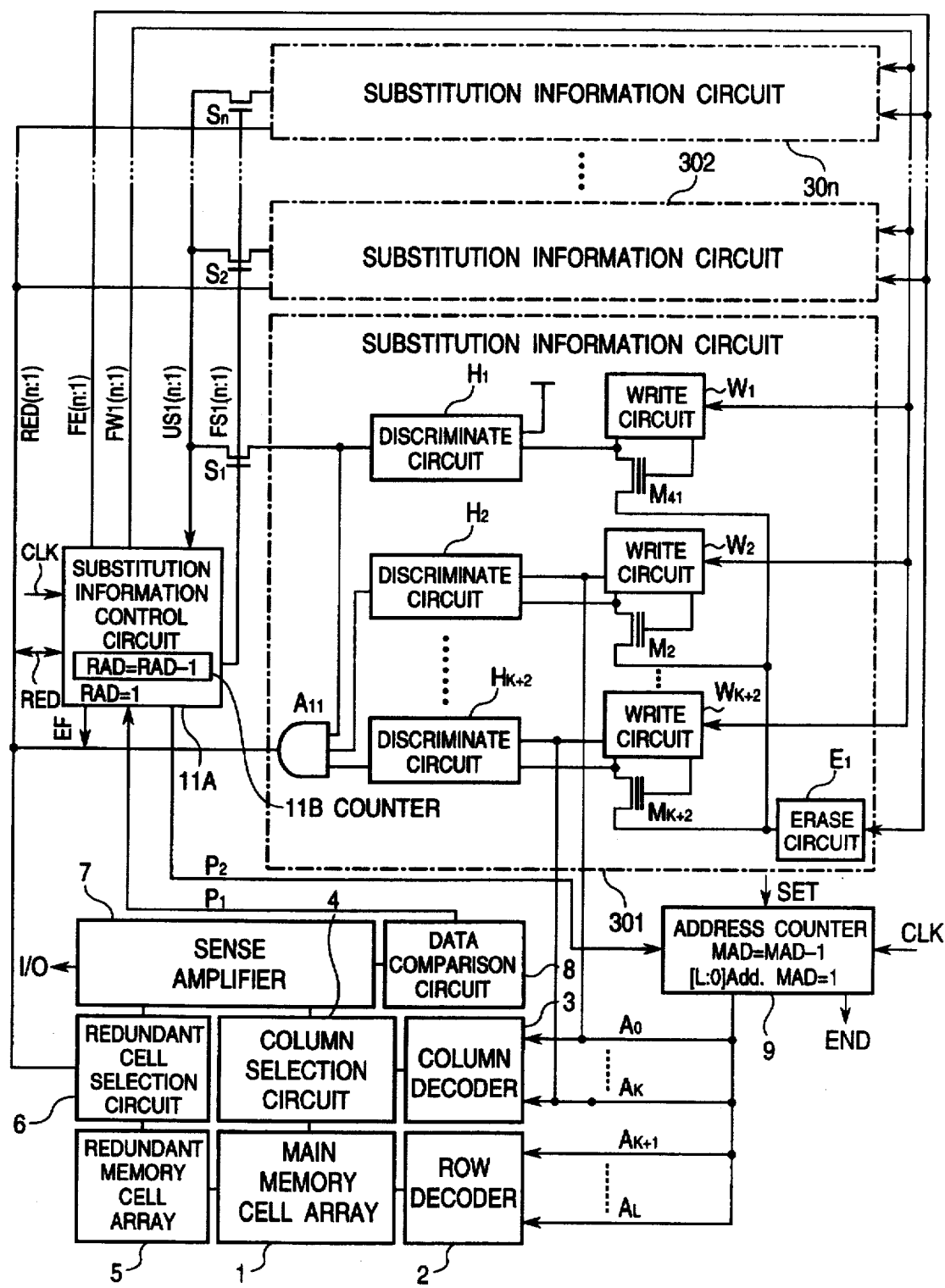
FIG. 7 is a block diagram illustrating a second embodiment of the semiconductor memory in accordance with the present invention.

Referring to FIG. 7, there is shown a block diagram illustrating a second embodiment of the semiconductor memory in accordance with the present invention. In FIG. 7, elements similar to those shown in FIG. 5 are given the same Reference Numerals and Signs, and explanation thereof will be omitted.

As seen from comparison between FIGS. 5 and 7, the second embodiment is the same as the first embodiment, except that the second embodiment includes, in place of the substitution information circuits 101 to 10n, substitution information circuits 301 to 30n in each of which the redundant memory cell use inhibit information storing memory cell M0, the write circuit W0, the discriminating circuit H0, and the inverters I1 and I2 are omitted, and furthermore, the switch circuits S11 to S1n are omitted.

Thus, the second embodiment ignores the erratic erase defective occurring in the redundant memory cell array 5.

The redundant memory substitution procedure conducted in the second embodiment is completely the same as that illustrated in FIG. 6B, and explanation will be omitted.

Accordingly, the second embodiment is simpler in construction than the first embodiment. On the other hand, since the redundant memory cell array has only a memory capacity considerably smaller than that of the main memory cell array, probability of the erratic erase defective occurring in the redundant memory cell array, is low, and therefore, in a practical use, the second embodiment has an advantage similar to that obtained in the first embodiment.

As seen from the above, the semiconductor memory in accordance with the present invention and the method in accordance with the present invention for substituting the redundant memory cell, are characterized in that each substitution information storing means has a substitution information erasing means for erasing the substitution information stored in the memory element when the defectiveness of the defective memory cell is dissolved. Therefore, when the defectiveness of the defective memory cell which is included in the main memory cell array and which is replaced by a redundant memory cell, is dissolved, the substitution data stored in the substitution information storing means corresponding to the redundant memory cell is erased, the original memory cell in the main memory cell array can be used again, and the redundant memory cell can be substituted for another defective memory cell which is newly found out in the main memory cell array. Therefore, the necessary number of redundant memory cells can be reduced. In addition, with reduction of the number of redundant memory cells, the peripheral circuits can be reduced, with the result that a circuit area increasing factor can be eliminated.

The invention has thus been shown and described with reference to the specific embodiments. However, it should be noted that the present invention is in no way limited to the details of the illustrated structures but changes and modifications may be made within the scope of the appended claims.

I claim:

1. A flash electrically erasable programmable non-volatile semiconductor memory comprising:

a main memory cell part including a number of main memory cells;

a redundant memory cell part divided into a plurality of substitution units each of which includes a plurality of redundant memory cells and each of which is to be substituted for a unit of the same number of main memory cells containing a defective main memory cell; and an automatic substituting means including a plurality of substitution information storing means each having a memory element storing the substitution information for a corresponding one of said substitution units of said redundant memory cell part, and a substitution information control means for controlling a writing and a reading of the substitution information in said plurality of substitution information storing means, wherein each of said plurality of substitution information storing means includes an erase means for erasing, when the defectiveness of said defective main memory cell in said main memory cell array is dissolved, said substitution information stored in said memory element in the substitution information storing means corresponding to said defective main memory cell.

2. A semiconductor memory claimed in claim 1 wherein each of said plurality of substitution information storing means includes a plurality of memory elements for storing a redundant memory cell selection information indicating that the corresponding substitution unit of said redundant memory cell part is selected for redundant memory cell substitution, and a defective address indicating an address of a main memory cell having a threshold lower than a normal threshold, after the flash erasing of said main memory cell part.

3. A semiconductor memory claimed in claim 1 wherein said memory element is formed of an electrically erasable programmable non-volatile semiconductor memory cell.

4. A semiconductor memory claimed in claim 2 wherein each of said plurality of substitution information storing means further includes an additional memory element for storing use inhibit information indicating that the corresponding substitution unit of said redundant memory cell part includes a redundant memory cell having a threshold lower than a normal threshold, after the flash erasing of said redundant memory cell part.

5. A semiconductor memory claimed in claim 2 wherein said substitution information control means controls said substitution information storing means in such a manner that, when the flash erasing of said main memory cell part is carried out, if a defective main memory cell is found, the address of said defective main memory cell and said redundant memory cell selection information are stored in said memory elements in a corresponding substitution information storing means, and wherein said substitution information control means controls said substitution information storing means in such a manner that, when the flash erasing of said main memory cell part is carried out, if defectiveness of said defective main memory cell is dissolved, said address of said defective main memory cell and said redundant memory cell selection information stored in said memory elements in said corresponding substitution information storing means, are erased.

6. A method for substituting a redundant memory cell in a flash electrically erasable programmable non-volatile semiconductor memory which comprises:

a main memory cell part including a number of main memory cells;

a redundant memory cell part divided into a plurality of substitution units each of which includes a plurality of redundant memory cells and each of which is to be substituted for a unit of the same number of main memory cells containing a defective main memory cell; and an automatic substituting means including a plurality of substitution information storing means each having a memory element storing the substitution information for a corresponding one of said substitution units of said redundant memory cell part, the method comprising:

a first step of detecting a defective main memory cell having a threshold lower than a predetermined normal threshold, in said main memory cell part at the time of a flash erasing of said main memory cell part;

a second step of, when no defective main memory cell is not found as the result of said detecting in said first step, erasing the substitution information stored in said substitution information storing means; and a third step of, when a defective main memory cell is found as the result of said detecting in said first step, substituting one redundant memory cell substitution unit for a unit of the same number of main memory cells including said defective main memory cell.

7. A method claimed in claim 6 further including:

a fourth step of detecting a defective redundant memory cell having a threshold lower than a predetermined normal threshold, in said main memory cell part at the time of a flash erasing of said redundant memory cell part;

a fifth step of, when no defective redundant memory cell is not found as the result of said detecting in said fourth step, erasing a use inhibit information stored in said substitution information storing means to indicate that a redundant memory cell substitution unit corresponding to said substitution information storing means includes a defective redundant memory cell; and a sixth step of, when a defective redundant memory cell is found as the result of said detecting in said fourth step, writing said use inhibit information in said substitution information storing means corresponding to a redundant memory cell substitution unit including said defective redundant memory cell, said fourth to sixth steps being conducted before said first to third steps.

8. A method for substituting a redundant memory cell in a flash electrically erasable programmable non-volatile semiconductor memory which comprises:

a main memory cell part including a number of main memory cells;

a redundant memory cell part divided into a plurality of substitution units each of which includes a plurality of redundant memory cells and each of which is to be substituted for a unit of the same number of main memory cells containing a defective main memory cell; and a plurality of substitution information storing means each having a memory element storing a redundant memory cell substitution information, the method comprising:

a first step of erasing said redundant memory cell substitution information;

a second step of detecting, in said main memory cell part, a defective redundant memory cell having a threshold lower than a predetermined normal threshold;

a third step of, when a detective main memory cell is found as the result of said detecting in said second step, substituting one redundant memory cell substitution unit for a unit of the same number of main memory cells including said defective main memory cell.

* * * * *